(12) United States Patent
Chow et al.

(10) Patent No.: US 8,354,304 B2
(45) Date of Patent: Jan. 15, 2013

(54) SEMICONDUCTOR DEVICE AND METHOD OF FORMING CONDUCTIVE POSTS EMBEDDED IN PHOTOSENSITIVE ENCAPSULANT

(75) Inventors: Seng Guan Chow, Singapore (SG); Il Kwon Shim, Singapore (SG); Heap Hoe Kuan, Singapore (SG); Rui Huang, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 157 days.

(21) Appl. No.: 12/329,430

(22) Filed: Dec. 5, 2008

(65) Prior Publication Data

US 2010/0144101 A1 Jun. 10, 2010

(51) Int. Cl.
*H01L 21/00* (2006.01)

(52) U.S. Cl. .......................... 438/127; 438/112; 257/774
(58) Field of Classification Search .................. 438/112, 438/127; 257/774
See application file for complete search history.

(56) References Cited

U.S. PATENT DOCUMENTS

| | | | |
|---|---|---|---|
| 5,250,843 A | 10/1993 | Eichelberger | |
| 5,353,498 A | 10/1994 | Fillion et al. | |
| 5,804,084 A * | 9/1998 | Nasby et al. | ...................... 216/2 |
| 5,841,193 A | 11/1998 | Eichelberger | |
| 7,545,047 B2 * | 6/2009 | Bauer et al. | .................... 257/774 |
| 7,619,901 B2 | 11/2009 | Eichelberger et al. | |
| 7,714,454 B2 * | 5/2010 | Mueller-Hipper et al. | ... 257/787 |
| 2003/0062624 A1 * | 4/2003 | Asahi et al. | .................... 257/758 |
| 2004/0145874 A1 * | 7/2004 | Pinel et al. | .................... 361/748 |
| 2006/0063312 A1 | 3/2006 | Kurita | |
| 2007/0026662 A1 | 2/2007 | Kawano et al. | |
| 2008/0079163 A1 | 4/2008 | Kurita et al. | |
| 2008/0136046 A1 * | 6/2008 | Hashimoto | .................... 257/783 |
| 2008/0157402 A1 | 7/2008 | Ramakrishna et al. | |
| 2008/0296759 A1 | 12/2008 | Ramakrishna et al. | |
| 2008/0315375 A1 * | 12/2008 | Eichelberger et al. | ........ 257/659 |

* cited by examiner

*Primary Examiner* — David Vu
*Assistant Examiner* — Caleb Henry
(74) *Attorney, Agent, or Firm* — Robert D. Atkins; Patent Law Group: Atkins & Associates, P.C.

(57) ABSTRACT

A semiconductor package includes a post carrier having a base plate and plurality of conductive posts. A photosensitive encapsulant is deposited over the base plate of the post carrier and around the conductive posts. The photosensitive encapsulant is etched to expose a portion of the base plate of the post carrier. A semiconductor die is mounted to the base plate of the post carrier within the etched portions of the photosensitive encapsulant. A second encapsulant is deposited over the semiconductor die. A first circuit build-up layer is formed over the second encapsulant. The first circuit build-up layer is electrically connected to the conductive posts. The base plate of the post carrier is removed and a second circuit build-up layer is formed over the semiconductor die and the photosensitive encapsulant opposite the first circuit build-up layer. The second circuit build-up layer is electrically connected to the conductive posts.

25 Claims, 8 Drawing Sheets

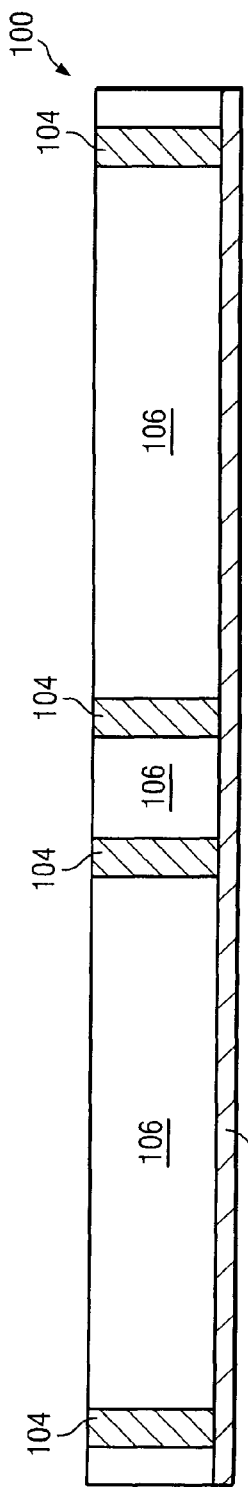
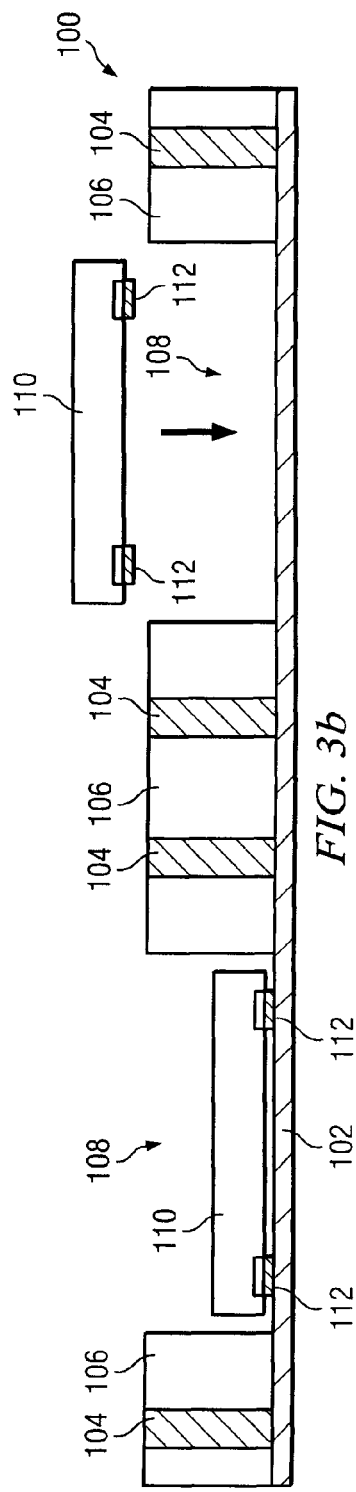
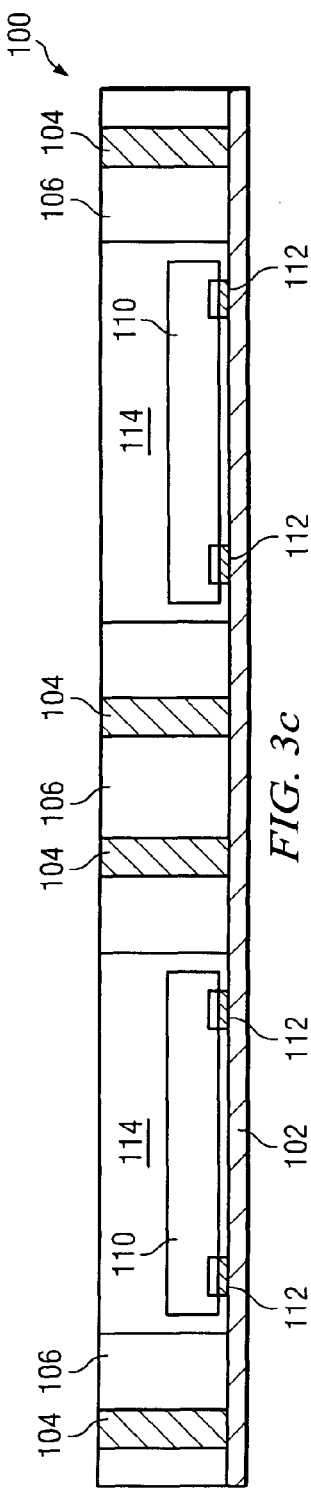
FIG. 3a
FIG. 3b
FIG. 3c

FIG. 4g

SEMICONDUCTOR DEVICE AND METHOD OF FORMING CONDUCTIVE POSTS EMBEDDED IN PHOTOSENSITIVE ENCAPSULANT

FIELD OF THE INVENTION

The present invention relates in general to semiconductor devices and, more particularly, to a semiconductor package having conductive posts embedded in a structurally protective encapsulant.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power generation, networks, computers, and consumer products. Semiconductor devices are also found in electronic products including military, aviation, automotive, industrial controllers, and office equipment.

Semiconductor devices exploit the electrical properties of semiconductor materials. The atomic structure of semiconductor material allows its electrical conductivity to be manipulated by the application of an electric field or through the process of doping. Doping introduces impurities into the semiconductor material to manipulate and control the conductivity of the semiconductor device.

A semiconductor device contains active and passive electrical structures. Active structures, including transistors, control the flow of electrical current. By varying levels of doping and application of an electric field, the transistor either promotes or restricts the flow of electrical current. Passive structures, including resistors, diodes, and inductors, create a relationship between voltage and current necessary to perform a variety of electrical functions. The passive and active structures are electrically connected to form logic circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

In many applications, it is desirable to stack wafer level chip scale semiconductor packages for a higher level of circuit integration. In wafer level fan-out chip scale semiconductor packages, z-direction electrical interconnections have been provided to facilitate the electrical interconnect between the stacked packages. The z-direction electrical interconnects are typically formed by metal plating. The plating process is time-consuming and adds manufacturing cost and complexity. Alternatively, the z-direction electrical interconnects can be formed by mechanical conductive bonding. However, the high aspect ratio of the z-direction electrical interconnects makes handling difficult leading to defects and reduced manufacturing yield.

SUMMARY OF THE INVENTION

In one embodiment, the present invention is a method of making a semiconductor package comprising providing a post carrier including a base plate and plurality of conductive posts, disposing a photosensitive encapsulant over the base plate of the post carrier and around the conductive posts, and etching the photosensitive encapsulant to expose a portion of the base plate of the post carrier. The method includes mounting a semiconductor die to the base plate of the post carrier within the etched portions of the photosensitive encapsulant, depositing a second encapsulant over the semiconductor die, and forming a first circuit build-up layer over the second encapsulant. The first circuit build-up layer is electrically connected to the conductive posts. The method includes removing the base plate of the post carrier, and forming a second circuit build-up layer over the semiconductor die and the photosensitive encapsulant opposite the first circuit build-up layer. The second circuit build-up layer is electrically connected to the conductive posts.

In another embodiment, the present invention is a method of making a semiconductor package comprising providing a post carrier including a base plate and plurality of conductive posts, disposing a photosensitive encapsulant over the base plate of the post carrier and around the conductive posts, and etching the photosensitive encapsulant to expose a portion of the base plate of the post carrier. The method includes mounting a semiconductor die to the base plate of the post carrier within the etched portions of the photosensitive encapsulant, and forming a first build-up layer over a first side of the photosensitive encapsulant. The first build-up layer is electrically connected to the conductive posts.

In another embodiment, the present invention is a method of making a semiconductor package comprising providing a post carrier including a base plate and plurality of conductive posts, disposing a photosensitive encapsulant over the base plate of the post carrier and around the conductive posts, and etching the photosensitive encapsulant to expose a portion of the base plate of the post carrier. The method includes mounting a semiconductor die to the base plate of the post carrier within the etched portions of the photosensitive encapsulant, and connecting an interconnect structure to the conductive posts.

In another embodiment, the present invention is a method of making a semiconductor package comprising providing a post carrier including a base plate and a conductive post, and disposing a photosensitive encapsulant over the base plate of the post carrier and around the conductive post. The method includes etching the photosensitive encapsulant to expose a portion of the base plate of the post carrier, and mounting a semiconductor die to the base plate of the post carrier within the etched portions of the photosensitive encapsulant.

BRIEF DESCRIPTION OF THE DRAWINGS

FIGS. 3a-3f illustrate a process of forming a wafer level fan-out chip scale semiconductor package using a photosensitive encapsulant to structurally support and protect z-direction conductive posts during fabrication; and FIGS. 4a-4g illustrate a process of forming a wafer level fan-out chip scale semiconductor package using a photosensitive encapsulant to structurally support and protect z-direction conductive posts during fabrication, the device is planarized to expose a top surface of the dies.

DETAILED DESCRIPTION OF THE DRAWINGS

Figure 1:
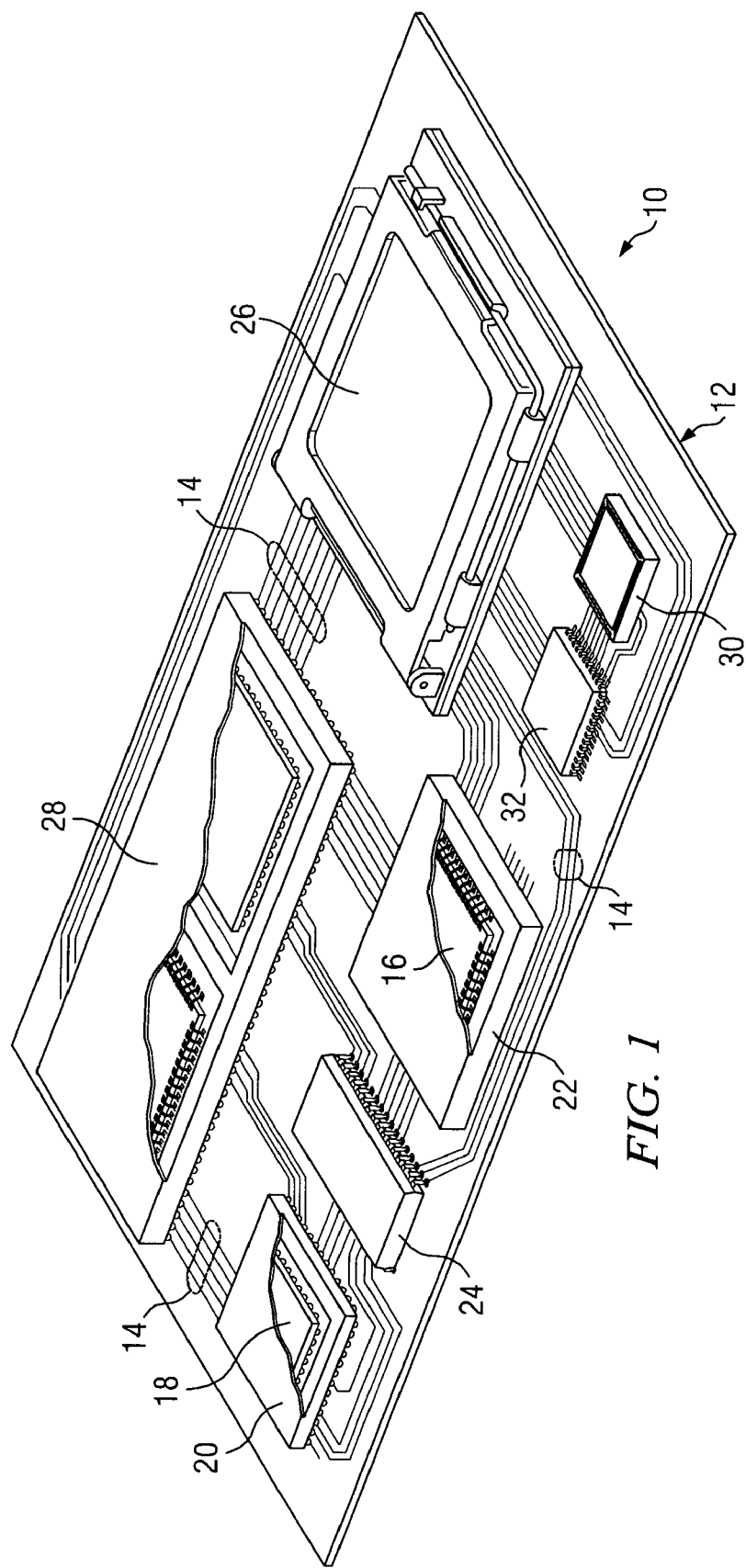
FIG. 1 illustrates a printed circuit board (PCB) with different types of packages mounted to its surface.

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components which are electrically connected to form functional electrical circuits. Active electrical components, such as transistors, have the ability to control the flow of electrical current. Passive electrical components, such as capacitors, inductors, resistors, and transformers, create a relationship between voltage and current necessary to perform electrical circuit functions.

Passive and active components are formed on the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into a permanent insulator, permanent conductor, or changing the way the semiconductor material changes in conductivity in response to an electric field. Transistors contain regions of varying types and degrees of doping arranged as necessary to enable the transistor to promote or restrict the flow of electrical current upon the application of an electric field.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting device or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 10 having a chip carrier substrate or printed circuit board (PCB) 12 with a plurality of semiconductor packages mounted on its surface. Electronic device 10 may have one type of semiconductor package, or multiple types of semiconductor packages, depending on the application. The different types of semiconductor packages are shown in FIG. 1 for purposes of illustration.

Electronic device 10 may be a stand-alone system that uses the semiconductor packages to perform an electrical function. Alternatively, electronic device 10 may be a subcomponent of a larger system. For example, electronic device 10 may be a graphics card, network interface card, or other signal processing card that can be inserted into a computer. The semiconductor package can include microprocessors, memories, application specific integrated circuits (ASICs), logic circuits, analog circuits, RF circuits, discrete devices, or other semiconductor die or electrical components.

In FIG. 1, PCB 12 provides a general substrate for structural support and electrical interconnect of the semiconductor packages mounted on the PCB. Conductive signal traces 14 are formed on a surface or within layers of PCB 12 using evaporation, electrolytic plating, electroless plating, screen printing, PVD, or other suitable metal deposition process. Signal traces 14 provide for electrical communication between each of the semiconductor packages, mounted components, and other external system components. Traces 14 also provide power and ground connections to each of the semiconductor packages.

In some embodiments, a semiconductor device has two packaging levels. First level packaging is the technique for mechanically and electrically attaching the semiconductor die to a carrier. Second level packaging involves mechanically and electrically attaching the carrier to the PCB. In other embodiments, a semiconductor device may only have the first level packaging where the die is mechanically and electrically mounted directly to the PCB.

For the purpose of illustration, several types of first level packaging, including wire bond package 16 and flip chip 18, are shown on PCB 12. Additionally, several types of second level packaging, including ball grid array (BGA) 20, bump chip carrier (BCC) 22, dual in-line package (DIP) 24, land grid array (LGA) 26, multi-chip module (MCM) 28, quad flat non-leaded package (QFN) 30, and quad flat package 32, are shown mounted on PCB 12. Depending upon the system requirements, any combination of semiconductor packages, configured with any combination of first and second level packaging styles, as well as other electronic components, can be connected to PCB 12. In some embodiments, electronic device 10 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a shorter manufacturing process. The resulting devices are less likely to fail and less expensive to manufacture resulting in lower costs for consumers.

Figure 2A:
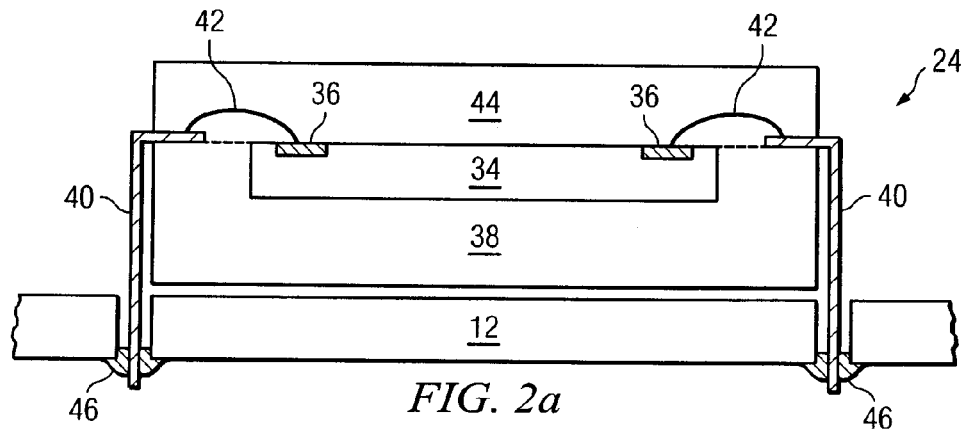
FIGS. 2a-2c illustrate further detail of the representative semiconductor packages mounted to the PCB.

FIG. 2a illustrates further detail of DIP 24 mounted on PCB 12. DIP 24 includes semiconductor die 34 having contact pads 36. Semiconductor die 34 includes an active area containing analog or digital circuits implemented as active devices, passive devices, conductive layers, and dielectric layers formed within semiconductor die 34 and are electrically interconnected according to the electrical design of the die. For example, the circuit may include one or more transistors, diodes, inductors, capacitors, resistors, and other circuit elements formed within the active area of die 34. Contact pads 36 are made with a conductive material, such as aluminum (Al), copper (Cu), tin (Sn), nickel (Ni), gold (Au), or silver (Ag), and are electrically connected to the circuit elements formed within die 34. Contact pads 36 are formed by PVD, CVD, electrolytic plating, or electroless plating process. During assembly of DIP 24, semiconductor die 34 is mounted to a carrier 38 using a gold-silicon eutectic layer or adhesive material such as thermal epoxy. The package body includes an insulative packaging material such as polymer or ceramic. Conductor leads 40 are connected to carrier 38 and wire bonds 42 are formed between leads 40 and contact pads 36 of die 34 as a first level packaging. Encapsulant 44 is deposited over the package for environmental protection by preventing moisture and particles from entering the package and contaminating die 34, contact pads 36, or wire bonds 42. DIP 24 is connected to PCB 12 by inserting leads 40 into holes formed through PCB 12. Solder material 46 is flowed around leads 40 and into the holes to physically and electrically connect DIP 24 to PCB 12. Solder material 46 can be any metal or electrically conductive material, e.g., Sn, lead (Pb), Au, Ag, Cu, zinc (Zn), bismuthinite (Bi), and alloys thereof, with an optional flux material. For example, the solder material can be eutectic Sn/Pb, high-lead, or lead-free.

Figure 2B:
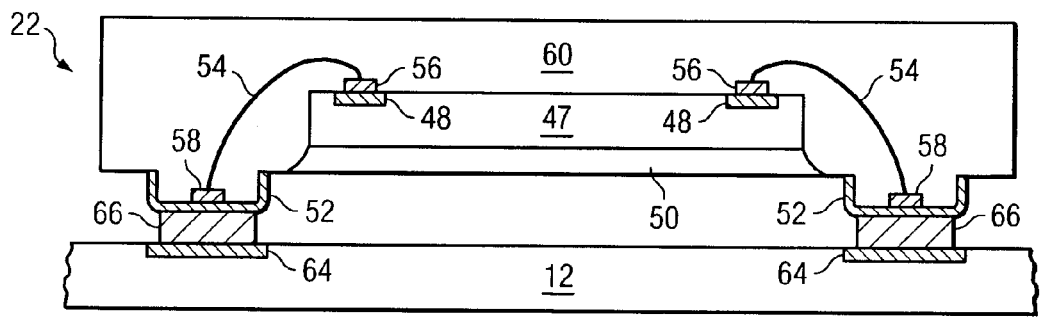

FIG. 2b illustrates further detail of BCC 22 mounted on PCB 12. Semiconductor die 47 is connected to a carrier by wire bond style first level packaging. BCC 22 is mounted to PCB 12 with a BCC style second level packaging. Semiconductor die 47 having contact pads 48 is mounted over a carrier using an underfill or epoxy-resin adhesive material 50. Semiconductor die 47 includes an active area containing analog or digital circuits implemented as active devices, passive devices, conductive layers, and dielectric layers formed within semiconductor die 47 and are electrically interconnected according to the electrical design of the die. For example, the circuit may include one or more transistors, diodes, inductors, capacitors, resistors, and other circuit elements formed within the active area of die 47. Contact pads 48 are made with a conductive material, such as Al, Cu, Sn, Ni, Au, or Ag, and are electrically connected to the circuit elements formed within die 47. Contact pads 48 are formed by PVD, CVD, electrolytic plating, or electroless plating process. Wire bonds 54 and bond pads 56 and 58 electrically connect contact pads 48 of semiconductor die 47 to contact pads 52 of BCC 22 forming the first level packaging. Molding compound or encapsulant 60 is deposited over semiconductor die 47, wire bonds 54, contact pads 48, and contact pads 52 to provide physical support and electrical isolation for the device. Contact pads 64 are formed on a surface of PCB 12 using evaporation, electrolytic plating, electroless plating, screen printing, PVD, or other suitable metal deposition process and are typically plated to prevent oxidation. Contact pads 64 electrically connect to one or more conductive signal traces 14. Solder material is deposited between contact pads 52 of BCC 22 and contact pads 64 of PCB 12. The solder material is reflowed to form bumps 66 which form a mechanical and electrical connection between BCC 22 and PCB 12.

Figure 2C:
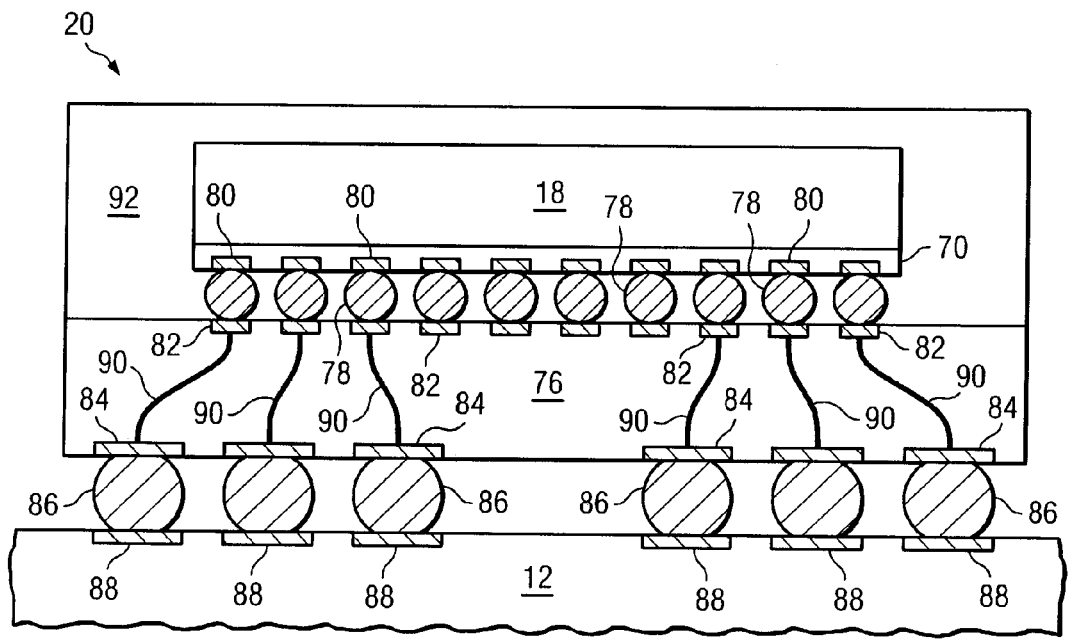

In FIG. 2c, semiconductor die 18 is mounted face down to carrier 76 with a flip chip style first level packaging. BGA 20 is attached to PCB 12 with a BGA style second level packaging. Active area 70 containing analog or digital circuits implemented as active devices, passive devices, conductive layers, and dielectric layers formed within semiconductor die 18 is electrically interconnected according to the electrical design of the die. For example, the circuit may include one or more transistors, diodes, inductors, capacitors, resistors, and other circuit elements formed within active area 70 of semiconductor die 18. Semiconductor die 18 is electrically and mechanically attached to carrier 76 through a large number of individual conductive solder bumps or balls 78. Solder bumps 78 are formed on bump pads or interconnect sites 80, which are disposed on active areas 70. Bump pads 80 are made with a conductive material, such as Al, Cu, Sn, Ni, Au, or Ag, and are electrically connected to the circuit elements formed in active area 70. Bump pads 80 are formed by PVD, CVD, electrolytic plating, or electroless plating process. Solder bumps 78 are electrically and mechanically connected to contact pads or interconnect sites 82 on carrier 76 by a solder reflow process.

BGA 20 is electrically and mechanically attached to PCB 12 by a large number of individual conductive solder bumps or balls 86. The solder bumps are formed on bump pads or interconnect sites 84. The bump pads 84 are electrically connected to interconnect sites 82 through conductive lines 90 routed through carrier 76. Contact pads 88 are formed on a surface of PCB 12 using evaporation, electrolytic plating, electroless plating, screen printing, PVD, or other suitable metal deposition process and are typically plated to prevent oxidation. Contact pads 88 electrically connect to one or more conductive signal traces 14. The solder bumps 86 are electrically and mechanically connected to contact pads or bonding pads 88 on PCB 12 by a solder reflow process. Molding compound or encapsulant 92 is deposited over semiconductor die 18 and carrier 76 to provide physical support and electrical isolation for the device. The flip chip semiconductor device provides a short electrical conduction path from the active devices on semiconductor die 18 to conduction tracks on PCB 12 in order to reduce signal propagation distance, lower capacitance, and achieve overall better circuit performance. In another embodiment, the semiconductor die 18 can be mechanically and electrically attached directly to PCB 12 using flip chip style first level packaging without carrier 76.

Figure 3D:
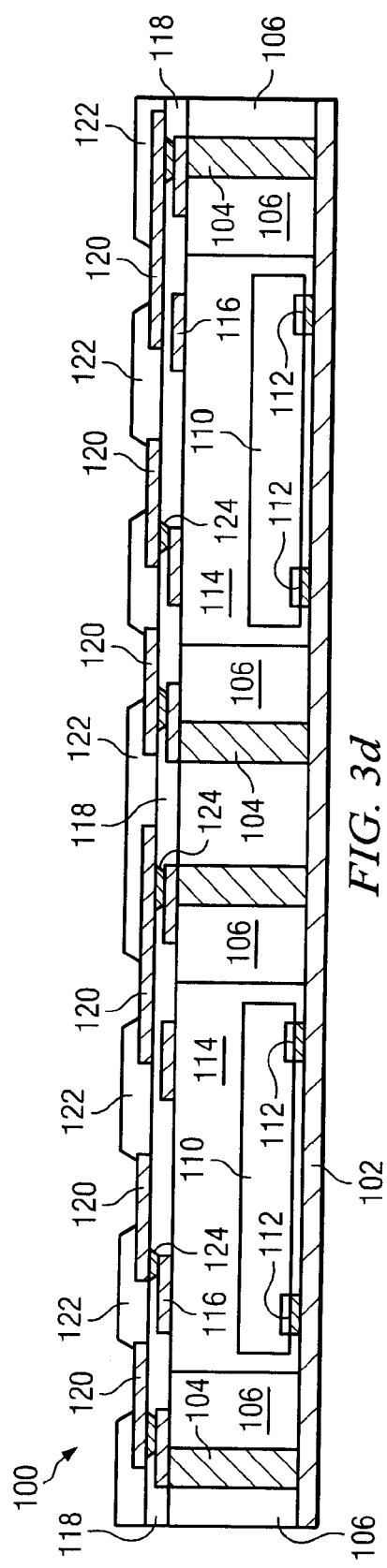

FIGS. 3a-3f illustrate a process of forming wafer level fan-out chip scale semiconductor package 100 using a photosensitive encapsulant to structurally support and protect z-direction conductive posts during fabrication. FIG. 3a shows a cross-sectional view of a prefabricated post carrier 102 with conductive posts 104 oriented in the z-direction or perpendicular with respect to the base plate of post carrier 102. Post carrier 102 and conductive posts 104 are typically Cu but can also be aluminum (Al) and Cu or Al alloys. Conductive posts 104 are round or square in cross-section and arranged in a rectangular array, such as a strip form, but can also be in the form of a wafer and include alternate cross-section shapes. Photosensitive encapsulant 106 is deposited over post carrier 102 and conductive posts 104. Photosensitive encapsulant 106 includes benzocyclobutene (BCB), polymethylmethacrylate (PMMA), polyimide (PI) or other photosensitive encapsulating materials.

Turning to FIG. 3b, cavities 108 are formed in photosensitive encapsulant 106. Cavities 108 may be formed using photolithography or an exposure and development process, as discussed above. As shown on FIG. 3b, cavities 108 expose portions of the base portion of post carrier 102. ICs or dies 110 are mounted within cavities 108 of photosensitive encapsulant 106 to post carrier 102. Dies 110 include contact pads or electrodes 112. Contact pads 112 include a conductive material and may be formed by PVD, CVD, electrolytic plating, or electroless plating processes. Optional wetting pads may be formed on a surface of post carrier 102 using plating or PVD to enhance the bond between dies 110 and post carrier 102.

As shown in FIG. 3c, encapsulant 114 is deposited over post carrier 102 and dies 110 using spin coating, screen printing, or top dispensing. In one embodiment, encapsulant 114 includes a molding compound deposited over post carrier 102 using a compressive molding, transfer molding, liquid encapsulant molding, liquid dispensing, or other suitable applicator. The encapsulant can include liquid epoxy, powder, epoxy resin, epoxy acrylate, polymer, or polymer composite material. After deposition, encapsulant 114 is planarized using chemical etching, mechanical grinding, or a combination of planarization or etching processes. After planarization, a top portion of conductive posts 104 is exposed. Depending upon the application, after planarization of encapsulant 114, a top surface of both conductive posts 104 and dies 110 may be exposed.

Turning to FIG. 3d, an electrical network or circuit is formed over a top surface of device 100. The circuit may include redistribution layers (RDLs), thin film devices (including integrated passive or active devices) and electrical interconnects (including external device contacts). With reference to FIG. 3d, the electrical circuit includes conductive layers 116 and 120, and insulating layers 118 and 122. Conductive layers 116 and 120 can be Al, Cu, Sn, Ni, Au, Ag, or other suitable electrically conductive material. Conductive layers 116 and 120 are formed by PVD, CVD, electrolytic plating, or electroless plating processes. Conductive layers 116 and 120 are electrically connected by conductive vias 124. Conductive layer 116 electrically connects to conductive posts 104. Conductive layer 120 can be RDLs or external contact pads. The insulating layers 118 and 122 can be silicon dioxide ($SiO_2$), silicon nitride ($Si_3N_4$), silicon oxynitride (SiON), tantalum pentoxide ($Ta_2O_5$), zircon ($ZrO_2$), aluminum oxide ($Al_2O_3$), or other material having suitable insulating properties. The deposition of insulating layers may involve PVD, CVD, printing, sintering, or thermal oxidation. The insulating layers may include single or multiple layers or electrically insulative material. The circuit formed over device 100 may include thin film semiconductor devices, such as active devices or integrated passive devices (IPDs), such as inductors, resistors, and capacitors. The thin film semiconductor circuit elements provide in part the necessary functionality of the semiconductor device.

Figure 3E:
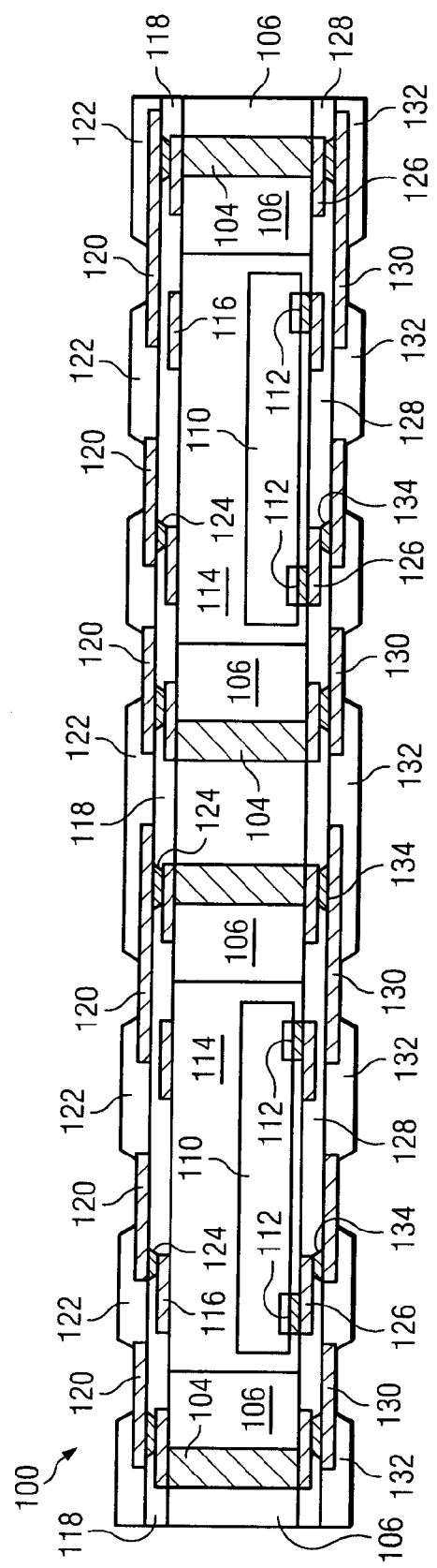

Turning to FIG. 3e, post carrier 102 is patterned to remove the bottom portion of post carrier 102 and expose a bottom surface of conductive posts 104 and contact pads 112 of dies 110. A second electrical network or circuit is formed over the bottom surface of device 100. The circuit may include RDLs, thin film devices (including integrated passive or active devices) and electrical interconnects (including external device contacts). The bottom-surface circuit includes conductive layers 126 and 130 and insulating layers 128 and 132. Conductive layers 126 and 130 can be Al, Cu, Sn, Ni, Au, Ag, or other suitable electrically conductive material. Conductive layers 126 and 130 are formed by PVD, CVD, electrolytic plating, or electroless plating processes. Conductive layers 126 and 130 are electrically connected by conductive via 134. Conductive layer 126 electrically connects to conductive posts 104. Conductive layer 130 can be RDLs or external contact pads. The insulating layers 128 and 132 can be $SiO_2$, $Si_3N_4$, SiON, $Ta_2O_5$, $ZrO_2$, $Al_2O_3$, or other material having suitable insulating properties. The deposition of the insulating layers may involve PVD, CVD, printing, sintering, or thermal oxidation. The insulating layers can include single or multiple layers of electrically insulative material. The bottom-surface circuit may further include thin film semiconductor devices, such as active devices or IPDs, such as inductors, resistors, and capacitors. The thin film semiconductor circuit elements provide in part the necessary functionality of the semiconductor device.

Figure 3F:
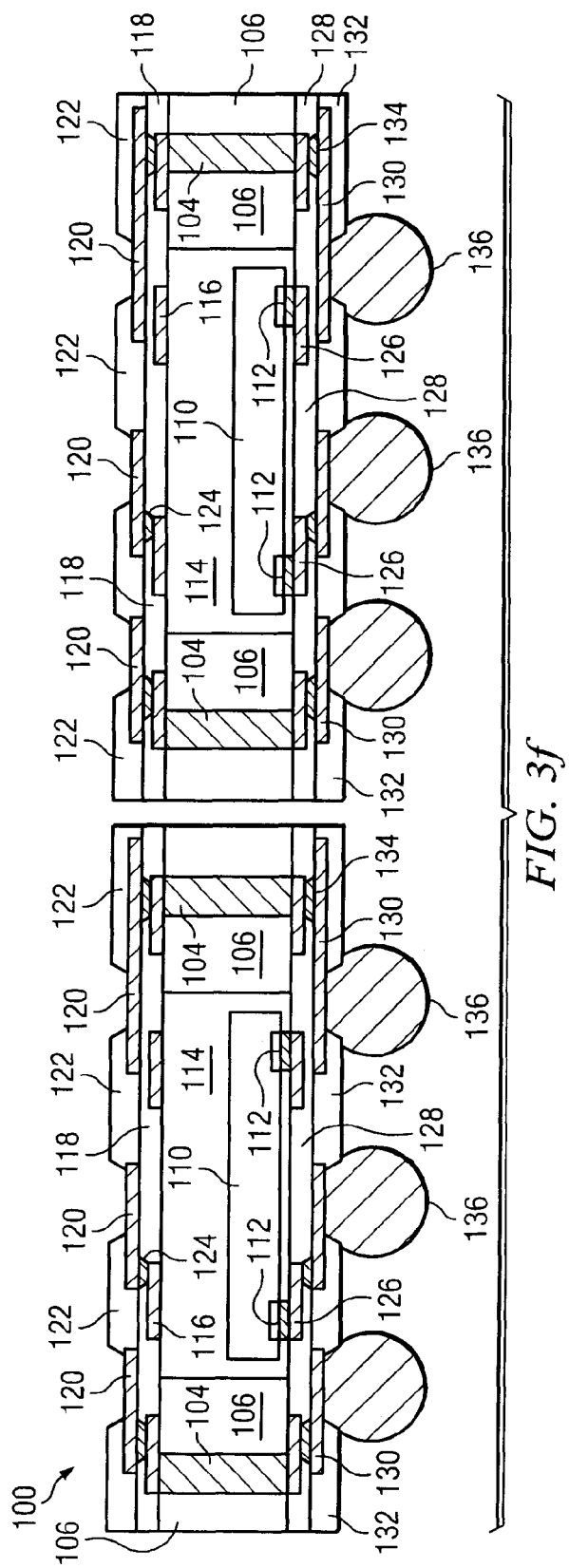

Turning to FIG. 3f, device 100 is singulated and an electrical interconnect structure is mounted to a bottom surface of device 100 and electrically connected to conductive layer 130. With reference to FIG. 3f, an electrically conductive solder material is deposited over conductive layer 130 using an evaporation, electrolytic plating, electroless plating, ball drop, or screen printing process. The solder material can be any metal or electrically conductive material, e.g., Sn, Ni, Au, Ag, Pb, Bi, and alloys thereof, with an optional flux material. For example, the solder material can be eutectic Sn/Pb, high lead, or lead free. The solder material is reflowed by heating the material above its melting point to form spherical balls or bumps 136. In some applications, solder bumps 136 are reflowed a second time to improve electrical contact to conductive layer 130. Solder bumps 136 represent one type of interconnect structure that can be formed on conductive layer 130. The interconnect structure can also use bond wires, 3D interconnects, conductive paste, or other electrical interconnect. The devices are singulated with a saw blade or laser cutting tool into individual wafer level chip scale semiconductor packages. Optional electrical interconnect structure may also be connected to a top surface of device 100, for example by forming conductive solder balls in contact with conductive layer 120.

Figure 4A:
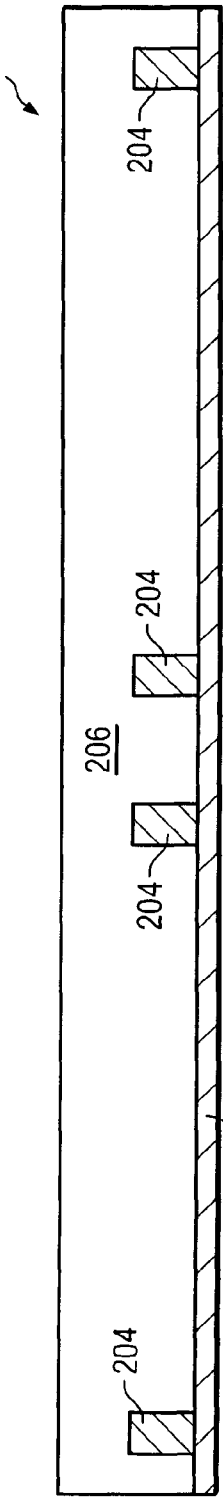

FIGS. 4a-4g illustrate a process of forming wafer level fan-out chip scale semiconductor package 200 using a photosensitive encapsulant to structurally support and protect z-direction conductive posts during fabrication, the device is planarized to expose a top surface of the dies. FIG. 4a shows a cross-sectional view of a prefabricated post carrier 202 with conductive posts 204 oriented in the z-direction or perpendicular with respect to the base plate of post carrier 202. Conductive posts 204 are round or square in cross-section and arranged in a rectangular array, such as a strip form, but can also be in the form of a wafer and include alternate cross-section shapes. Photosensitive encapsulant 206 is deposited over post carrier 202 and conductive posts 204. Photosensitive encapsulant 206 includes BCB, PMMA, PI or other photosensitive encapsulating materials.

Figure 4B:
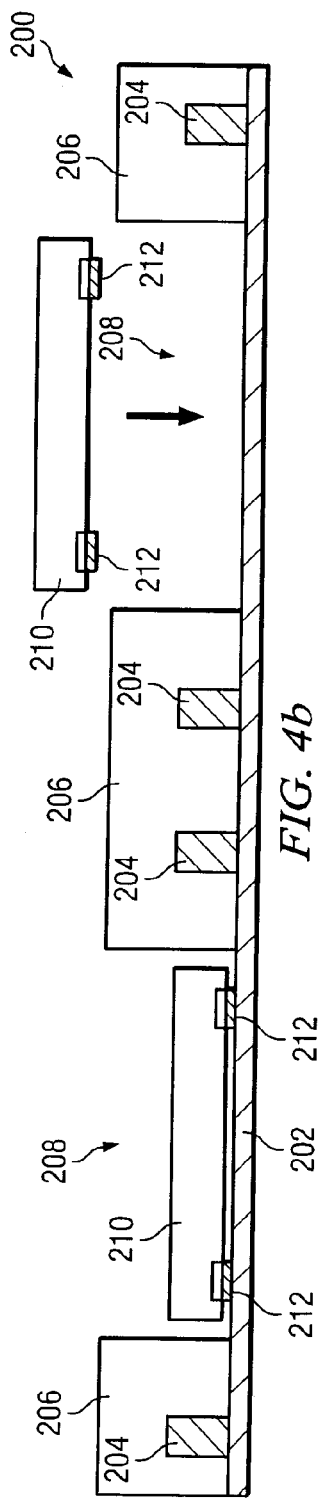

Turning to FIG. 4b, cavities 208 are formed in photosensitive encapsulant 206. Cavities 208 may be formed using photolithography, as discussed above. As shown on FIG. 4b, cavities 208 expose portions of the base portion of post carrier 202. ICs or dies 210 are mounted within cavities 208 of photosensitive encapsulant 206 to post carrier 202. Dies 210 include contact pads or electrodes 212. Contact pads 212 include a conductive material and may be formed by PVD, CVD, electrolytic plating, or electroless plating processes. Optional wetting pads may be formed on a surface of post carrier 202 using plating or PVD to enhance the bond between dies 210 and post carrier 202.

Figure 4C:
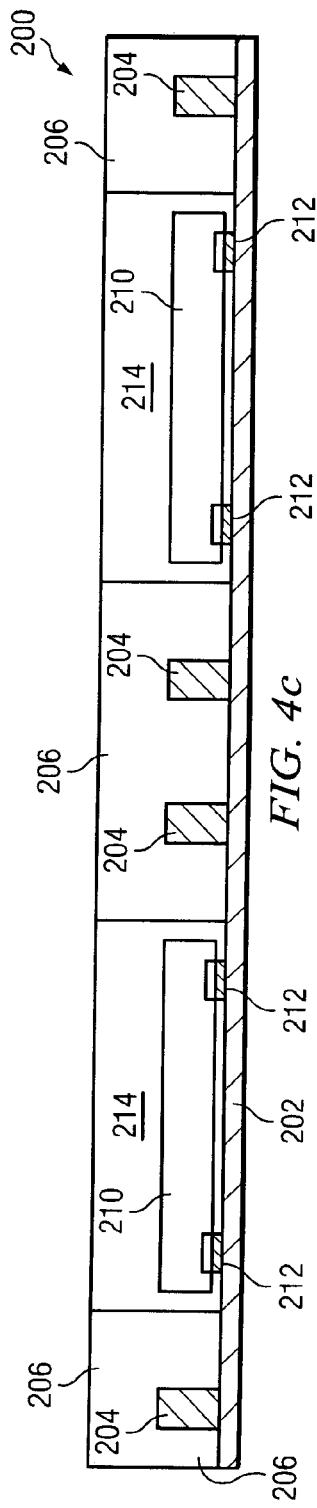

As shown in FIG. 4c, encapsulant 214 is deposited over post carrier 202 and dies 210 using spin coating, screen printing, or top dispensing. In one embodiment, encapsulant 214 includes a molding compound deposited over post carrier 202 using a compressive molding, transfer molding, liquid encapsulant molding, liquid dispensing, or other suitable applicator. The encapsulant can include liquid epoxy, powder, epoxy resin, epoxy acrylate, polymer, or polymer composite material.

Figure 4D:
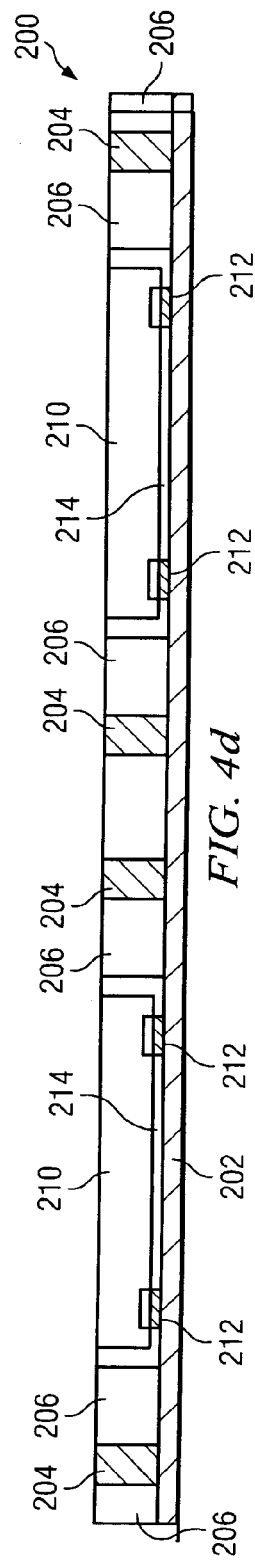

Turning to FIG. 4d, after deposition of encapsulant 214, encapsulant 214 is planarized using chemical etching, mechanical grinding, or a combination or planarization or etching processes. After planarization, a top portion of conductive posts 204 and dies 210 are exposed.

Figure 4E:
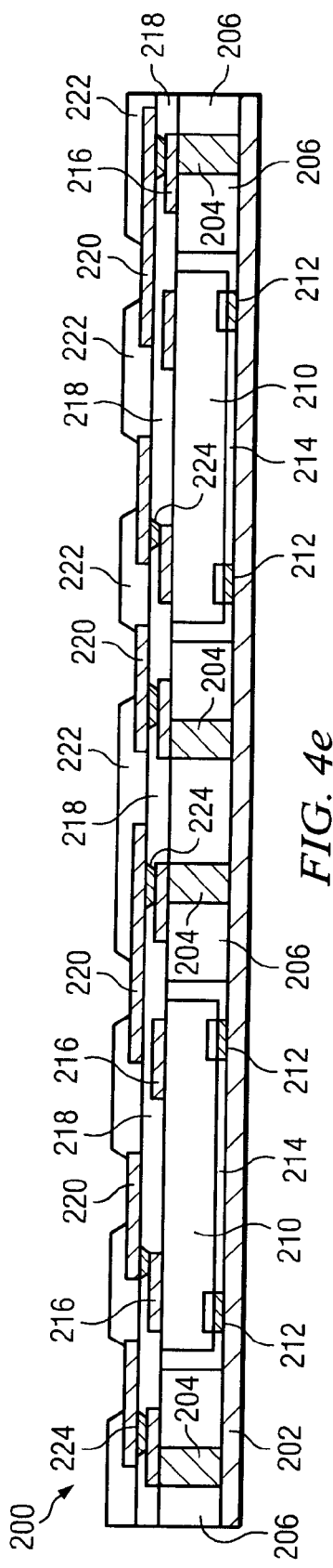

Turning to FIG. 4e, an electrical network or circuit is formed over a top surface of device 200. The circuit may include RDLs, thin film devices (including integrated passive or active devices) and electrical interconnects (including external device contacts). With reference to FIG. 4e, the electrical circuit includes conductive layers 216 and 220, and insulating layers 218 and 222. Conductive layers 216 and 220 can be Al, Cu, Sn, Ni, Au, Ag, or other suitable electrically conductive material. Conductive layers 216 and 220 are formed by PVD, CVD, electrolytic plating, or electroless plating processes. Conductive layers 216 and 220 are electrically connected by conductive via 224. Conductive layer 216 electrically connects to conductive posts 204. Conductive layer 220 can be RDLs or external contact pads. The insulating layers 218 and 222 can be SiO2, Si3N4, SiON, Ta2O5, ZrO2, Al2O3, or other material having suitable insulating properties. The deposition of insulating layers may involve PVD, CVD, printing, sintering, or thermal oxidation. The insulating layers may include single or multiple layers of electrically insulative material. The circuit formed over device 200 may include thin film semiconductor devices, such as active devices or IPDs, such as inductors, resistors, and capacitors. The thin film semiconductor circuit elements provide in part the necessary functionality of the semiconductor device.

Figure 4F:
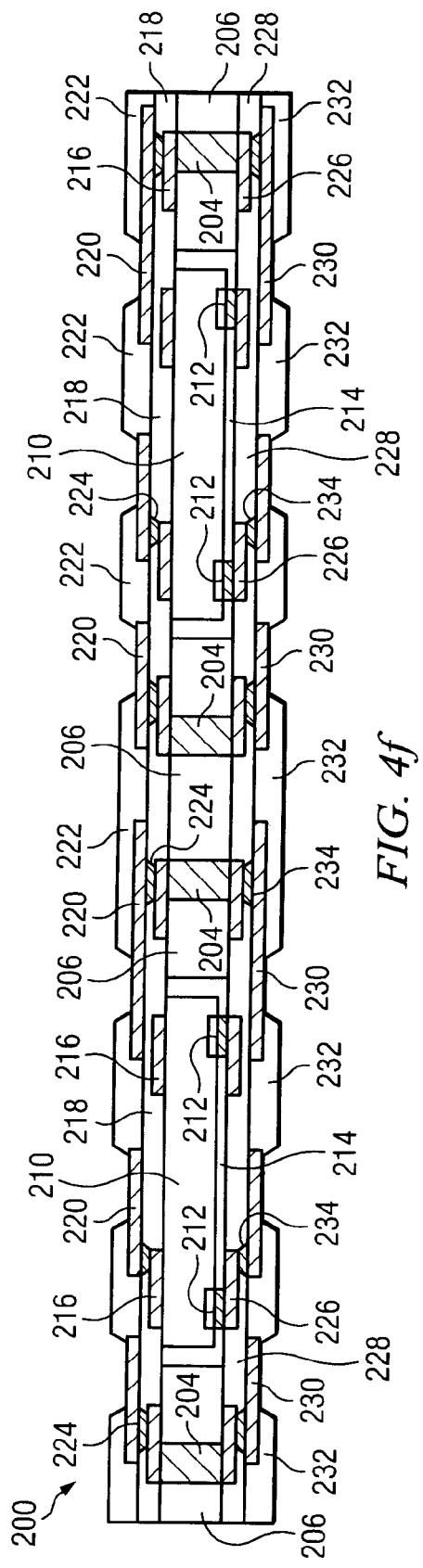

Turning to FIG. 4f, post carrier 202 is patterned to remove the bottom portion of post carrier 202 and to expose a bottom surface of conductive posts 204 and contact pads 212 of dies 210. A second electrical network or circuit is formed over the bottom surface of device 200. The circuit may include RDLs, thin film devices (including integrated passive or active devices) and electrical interconnects (including external device contacts). The bottom-surface circuit includes conductive layers 226 and 230 and insulating layers 228 and 232. Conductive layers 226 and 230 can be Al, Cu, Sn, Ni, Au, Ag, or other suitable electrically conductive material. Conductive layers 226 and 230 are formed by PVD, CVD, electrolytic plating, or electroless plating processes. Conductive layers 226 and 230 are electrically connected by conductive vias 234. Conductive layer 226 electrically connects to conductive posts 204. Conductive layer 230 can be RDLs or external contact pads. The insulating layers 228 and 232 can be SiO2, Si3N4, SiON, Ta2O5, ZrO2, Al2O3, or other material having suitable insulating properties. The deposition of the insulating layers may involve PVD, CVD, printing, sintering, or thermal oxidation. The insulating layers can include single or multiple layers of electrically insulative material. The bottom-surface circuit may further include thin film semiconductor devices, such as active devices or IPDs, such as inductors, resistors, and capacitors. The thin film semiconductor circuit elements provide in part the necessary functionality of the semiconductor device.

Figure 4G:
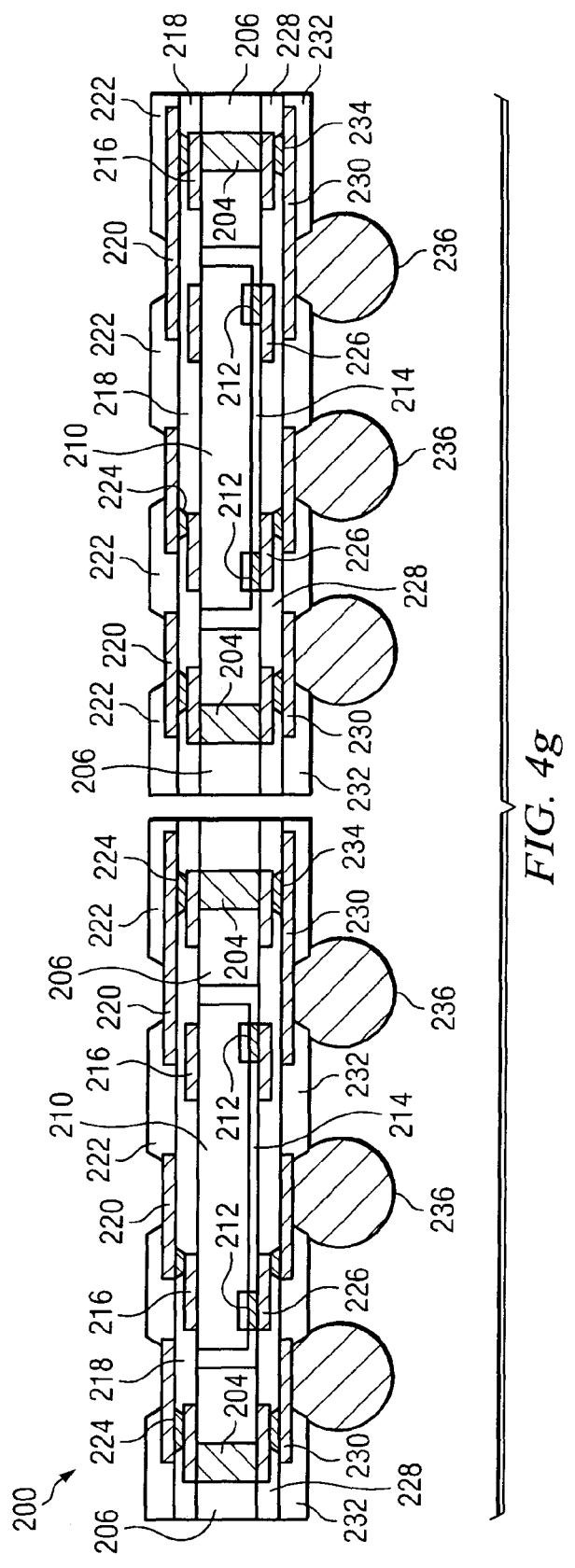

Turning to FIG. 4g, device 200 is singulated and an electrical interconnect structure is mounted to a bottom surface of device 200 and electrically connected to conductive layer 230. With reference to FIG. 4g, an electrically conductive solder material is deposited over conductive layer 230 using an evaporation, electrolytic plating, electroless plating, ball drop, or screen printing process. The solder material can be any metal or electrically conductive material, e.g., Sn, Ni, Au, Ag, Pb, Bi, and alloys thereof, with an optional flux material. For example, the solder material can be eutectic Sn/Pb, high lead, or lead free. The solder material is reflowed by heating the material above its melting point to form spherical balls or bumps 236. In some applications, solder bumps 236 are reflowed a second time to improve electrical contact to conductive layer 230. Solder bumps 236 represent one type of interconnect structure that can be formed on conductive layer 230. The interconnect structure can also use bond wires, 3D interconnects, conductive paste, or other electrical interconnect. The devices are singulated with a saw blade or laser cutting tool into individual wafer level chip scale semiconductor packages. Optional electrical interconnect structures may also be connected to a top surface of device 200, for example by forming conductive solder balls in contact with conductive layer 220.

While one or more embodiments of the present invention have been illustrated in detail, the skilled artisan will appreciate that modifications and adaptations to those embodiments may be made without departing from the scope of the present invention as set forth in the following claims.

What is claimed:
1. A method of making a semiconductor package, comprising:
providing a post carrier including a base plate and a plurality of conductive posts;
forming a photosensitive encapsulant on the base plate of the post carrier to surround the conductive posts;

after forming the photosensitive encapsulant on the base plate, etching the photosensitive encapsulant to expose a portion of the base plate;

mounting a semiconductor die to the exposed portion of the base plate such that upper surfaces of the conductive posts are disposed above an upper surface of the semiconductor die;

depositing a second encapsulant over the semiconductor die;

forming a first circuit build-up layer over the second encapsulant, the first circuit build-up layer being electrically connected to the conductive posts;

removing the base plate of the post carrier; and after removing the base plate, forming a second circuit build-up layer under the semiconductor die and the photosensitive encapsulant opposite the first circuit build-up layer, the second circuit build-up layer being electrically connected to the conductive posts.

2. The method of claim 1, including connecting an electrical interconnect structure to the second circuit build-up layer.

3. The method of claim 1, wherein the photosensitive encapsulant includes benzocyclobutene (BCB), polyimide (PI) or polymethylmethacrylate (PMMA).

4. The method of claim 1, including planarizing the second encapsulant using chemical etching, or mechanical grinding.

5. The method of claim 4, wherein planarizing the second encapsulant exposes a top surface of the conductive posts and the semiconductor die.

6. The method of claim 1, including arranging the conductive posts in a rectangular form around the base plate of the post carrier.

7. The method of claim 1, wherein the post carrier is prefabricated.

8. A method of making a semiconductor package, comprising:

providing a post carrier including a base plate and plurality of conductive posts;

forming a photosensitive encapsulant on the base plate of the post carrier to surround the conductive posts;

after forming the photosensitive encapsulant on the base plate, etching the photosensitive encapsulant to expose a portion of the base plate of the post carrier;

mounting a semiconductor die to the portion of the base plate such that an upper surface of the semiconductor die is disposed below upper surfaces of the conductive posts; and forming a first build-up layer over a first side of the photosensitive encapsulant, the first build-up layer being electrically connected to the conductive posts.

9. The method of claim 8, including removing the base plate of the post carrier.

10. The method of claim 9, including forming a second build-up layer over a second side of the photosensitive encapsulant opposite the first build-up layer, the second build-up layer being electrically connected to the conductive posts.

11. The method of claim 8, including depositing a second encapsulant over the semiconductor die.

12. The method of claim 8, further including arranging the conductive posts in a rectangular form around the base plate of the post carrier.

13. The method of claim 8, wherein the post carrier is prefabricated.

14. The method of claim 8, wherein the photosensitive encapsulant includes benzocyclobutene (BCB), polyimide (PI) or polymethylmethacrylate (PMMA).

15. A method of making a semiconductor package, comprising:

providing a post carrier including a base plate and plurality of conductive posts;

forming a photosensitive encapsulant on the base plate of the post carrier to surround the conductive posts;

after forming the photosensitive encapsulant on the base place, etching the photosensitive encapsulant to expose a portion of the base plate of the post carrier;

mounting a semiconductor die to the exposed portion of the base plate of the post carrier within the etched portions of the photosensitive encapsulant; and connecting an interconnect structure to the conductive posts.

16. The method of claim 15, including removing the base plate of the post carrier.

17. The method of claim 15, including forming a first build-up layer over a first side of the photosensitive encapsulant, the first build-up layer being electrically connected to the conductive posts.

18. The method of claim 17, including depositing a second encapsulant over the semiconductor die.

19. The method of claim 18, including planarizing the second encapsulant using chemical etching, or mechanical grinding.

20. The method of claim 15, wherein the photosensitive encapsulant includes benzocyclobutene (BCB), polyimide (PI) or polymethylmethacrylate (PMMA).

21. The method of claim 15, wherein the post carrier is prefabricated.

22. A method of making a semiconductor package, comprising:

providing a post carrier including a base plate and a conductive post;

disposing a photosensitive encapsulant over the base plate of the post carrier and around the conductive post;

etching the photosensitive encapsulant to expose a portion of the base plate of the post carrier; and mounting a semiconductor die to the base plate of the post carrier within the etched portions of the photosensitive encapsulant.

23. The method of claim 22, including forming a first build-up layer over a first side of the photosensitive encapsulant, the first build-up layer being electrically connected to the conductive posts.

24. The method of claim 22, including depositing a second encapsulant over the semiconductor die.

25. The method of claim 24, including planarizing the second encapsulant using chemical etching, or mechanical grinding to expose a top surface of the conductive post and the semiconductor die.

* * * * *